United States Patent [19]
Lim et al.

[11] Patent Number: 5,245,223
[45] Date of Patent: Sep. 14, 1993

[54] CMOS LATCHING COMPARATOR

[75] Inventors: Peter N. C. Lim, Normanton Park, Singapore; Larry S. Metz, Fort Collins; Charles E. Moore, Loveland, both of Colo.

[73] Assignee: Hewlett-Packard Company, Palo Alto, Calif.

[21] Appl. No.: 853,469

[22] Filed: Mar. 17, 1992

[51] Int. Cl.$^5$ .............................................. H03K 5/24
[52] U.S. Cl. .................. 307/362; 307/272.2; 307/530
[58] Field of Search ................ 307/272.2, 279, 291, 307/530, 362

[56] References Cited

U.S. PATENT DOCUMENTS

| | | | |
|---|---|---|---|
| 4,441,039 | 4/1984 | Schuster | 307/362 |
| 4,506,171 | 3/1985 | Evan et al. | 307/362 |
| 4,697,112 | 9/1987 | Ohtani et al. | 307/530 |
| 4,845,675 | 7/1989 | Krenik et al. | 307/530 |
| 4,973,864 | 11/1990 | Nogami | 307/279 |
| 5,172,011 | 12/1992 | Leuthold et al. | 307/272.2 |

Primary Examiner—John S. Heyman
Assistant Examiner—Shawn Riley

[57] ABSTRACT

A latching CMOS comparator method and circuit are disclosed. The comparator circuit includes a differential input stage and a latching stage. The input stage includes a differential amplifier (MP3,MP4) and a Moore Mirror load. The load includes a first cross-coupled amplifier pair (MN3,MN4), and a pair of diode-connected transistors (MN1,MN2) coupled in parallel to the first amplifier to control gain. The input stage devices are sized to provide a gain on the order of 10 to 20. The latch clock signal (CLK) is isolated from the input stage to avoid injected charge offset error. The second or latching stage includes a second cross-coupled transistor amplifier (MP7,MP8) coupled to the input stage to provide additional gain. The latch clock signal is provided to a digital switch (MP9,MP10) which controls gain in the second amplifier. The digital switch enables a second pair of diode-connected transistors (MP5,MP6) disposed in parallel to the latch stage amplifier pair, to reduce gain during sampling, for a total input referenced gain on the order of 60 during sampling. The digital switch disables the diode-connected transistors during latching, so that the second amplifier operates at maximum gain during latching. The digital switch circuitry isolates the latch clock signal from the latching nodes. After latching, the diode-connected devices speed recovery by clamping the latching node voltages. The latching nodes are coupled through inverters to an RS flip-flop circuit.

15 Claims, 2 Drawing Sheets

CMOS LATCHING COMPARATOR

BACKGROUND OF THE INVENTION

This invention relates to data acquisition and test & measurement circuitry such as digital-to-analog conversion (DAC) and analog-to-digital (ADC) circuits, and more particularly, relates to a latching CMOS comparator circuit, especially useful in sampled ADC applications.

Since A/D conversion techniques generally require combining analog and digital signal processing in the same chip, they are well suited for monolithic implementation in a MOS technology, such as CMOS technology. A number of circuit approaches have been developed for designing converters with MOS devices.

Successive-approximation converters represent an excellent compromise or trade-off between physical circuit size and converter speed requirements. The voltage comparator is a key element in the design of such devices. It is desirable that the comparator design be simple, tolerant to operating environment variations, and especially tolerant of mismatches in integrated circuit fabrication.

For data acquisition applications, among others, a comparator must also have latching capability. In other words, subsequent to a latch command, or latch clock signal transition (e.g. in a successive approximation ADC), the input stage of the comparator would be disabled and the logic state at the output stored indefinitely, until an enable or unlatched command (or subsequent latch clock state change) occurs. The changing voltage of the latch clock signal, however, can inject current into the comparator, via the parasitic gate capacitance, at latch time. This latching current surge can result in undesirable voltage offset due to device mismatch.

SUMMARY OF THE INVENTION

An object of the invention is to latch a comparator circuit while minimizing latching current surge, thereby improving tolerance to device and process mismatches.

Another object of the invention is to minimize hysteresis offset error due to the latching action in a latching comparator.

Another object of the invention is to improve comparator recovery time.

A further object of the invention is to design a useful latching comparator circuit for sample ADC applications and the like, using a general purpose CMOS process.

Another object of the invention is improve process tolerance, especially tolerance of capacitance mismatch, in the manufacture of commercial comparator integrated circuits.

The invention includes a two-stage CMOS latching comparator circuit. The new circuit comprises a bias current source coupled to the VDD supply to provide a predetermined bias current. The input stage, coupled to the bias current source, includes a first differential pair of transistors arranged to receive an input voltage VIN and a reference voltage VREF. The load on the input differential pair is provided by a circuit which we call the Moore Mirror.

The Moore Mirror circuit includes, first, a cross-coupled pair of transistors, each coupled between a respective one of the input differential pair and the VSS lower power supply rail. Second, each one of a pair of diode-connected transistors is coupled in parallel to a respective one of the first cross-coupled transistors to control gain in the first cross-coupled pair. We have found this arrangement to provide low common mode gain with substantial differential gain and a desirable level shifting effect. The foregoing devices form the input stage.

The second or latching stage of the new comparator includes a second differential pair of transistors, coupled to VSS and having input or gate terminals coupled to outputs of the input stage. The second differential pair drives a dual of the input stage Moore Mirror circuitry. Thus, a second cross-coupled pair of transistors are provided, each coupled between a respective one of the second differential pair and the VDD supply rail. Moreover, a second pair of diode-connected transistors are provided. However, each one of the second pair of diode-connected transistors is disposed between a respective one of the second cross-coupled pair and a common switch node. A digital switch, comprising a pair of switch transistors, is disposed between the switch node and the VDD rail for selectively coupling the switch node to VDD responsive to a binary latch clock signal.

The digital switch transistor gates are connected together to receive the latch clock signal. The switch is arranged so that the second pair of diode-connected transistors are coupled to VDD, i.e. they are coupled in parallel to the second cross-coupled pair of transistors during the sample state of the latch clock signal. When the latch clock changes to the latching state, the diode-connected transistors are isolated from VDD and, therefore, are effectively removed from the circuit. In other words, the diode-connected devices are disabled. This leaves the second (latching stage) cross-coupled pair operable as an uninhibited positive feedback amplifier during latching only.

The circuit isolates the latch clock signal from both pairs of sensitive nodes, i.e. from the outputs of the input stage, and from the outputs of the latching stage (the latching nodes). Accordingly, the latch clock signal switching cannot inject significant current surge as the sensitive nodes. The result, among other advantages, is reduced dependence on precise capacitance matching.

One example of an application of the invention is in a CMOS device that includes 48 refreshing sample and hold channels and 4 comparators. This can be used, for example, for IC tester multiplexing DAC and sample ADC applications. Illustrative specifications for the comparators are to resolve 1.2 mV input overdrive over a 10 V common mode range, with 1.2 mV linearity, less than 50 mV offset error, a set-up time of 1.25 microseconds and latching pulse width of 500 ns. These specifications are achievable using the present invention.

In the example, each comparator is configured to compare a voltage sampled and stored on a 13 pF on-chip capacitor against a driven input. The driven input supplies 12 different voltages for 12 consecutive comparisons to realize the 12 bits successive-approximation conversion of the sampled voltage.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Figure 1:
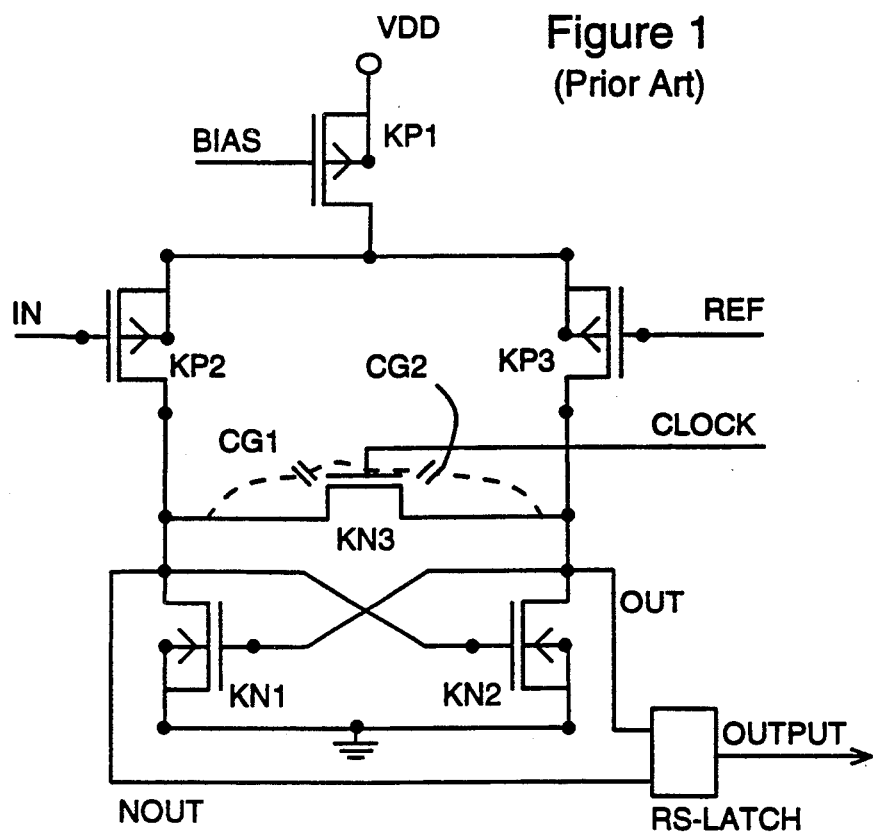
FIG. 1 is a schematic diagram of a known CMOS latching comparator circuit.
Figure 3:
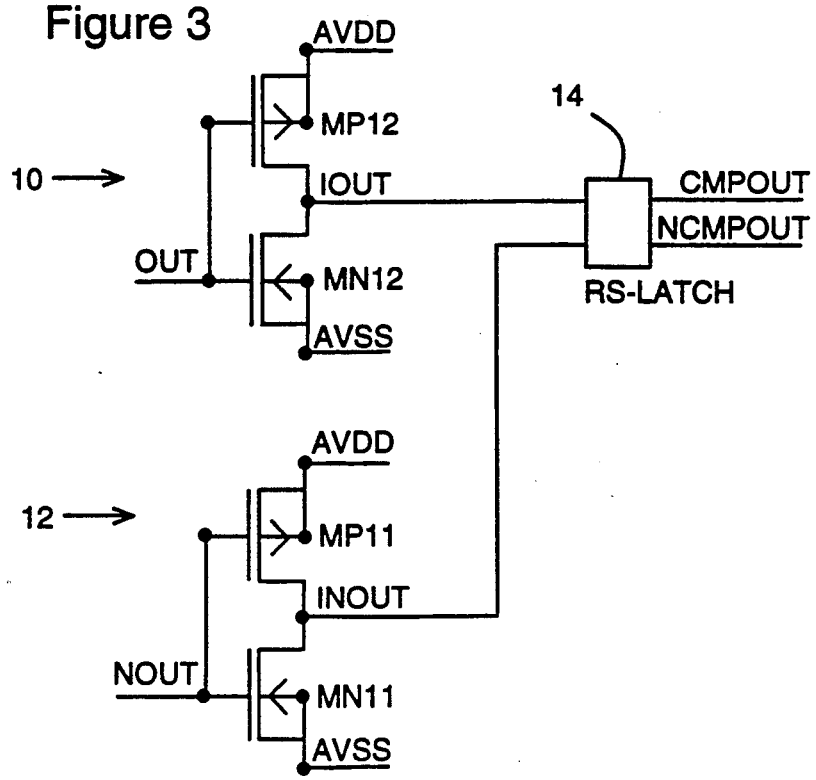
FIGS. 2—3 are a schematic diagram of a CMOS latching comparator circuit according to the present invention.

The preferred embodiment is best understood by first considering a prior art latching comparator circuit. An example of a prior art CMOS circuit is shown in FIG. 1. The circuit in FIG. 1 is simplified for ease of analysis. FIG. 1 shows, first of all, a FET device KP1 arranged to provide a bias current. FET KP1 is coupled to a supply voltage VDD and has its gate controlled by a predetermined bias voltage.

The bias current is provided to a differential pair of FET devices KP2 and KP3, each having a drain terminal coupled to the bias current source. The gates of FETs KP2 and KP3 are coupled to receive input signals IN(+) and REF(−), respectively. The outputs (source terminals) of FETs KP2 and KP3 are coupled to the drain terminals of FETs KN1 and KN2 respectively. KN1 and KN2 are arranged in a cross-coupled configuration, the gate of each device being connected to the drain terminal of the other device. The output nodes, OUT and NOUT are referred to as the latching nodes. The latching nodes are connected to an RS latch circuit to ensure adequate digital logic voltage levels at the final output node OUTPUT.

An additional FET device KN3 is connected across the latching nodes. The gate of KN3 is coupled to receive a binary latch clock signal CLOCK. When CLOCK is high, i.e. in sample state, KN3 is ON, providing essentially a small resistor load between the latching nodes. This tends to balance the circuit so that the bias current is divided evenly between KN1 and KN2, the cross-coupled amplifier pair. The latch node voltages are come together so that the RS flip-flop cannot change state.

When CLOCK goes low, to latch state, KN3 is turned OFF, and effectively removed from the circuit. A differential current from the input pair KP2,KP3 results in a differential voltage at the latching nodes. This differential voltage is amplified by the positive feedback amplifier so that the latching node voltages diverge in directions determined by the input voltage relative to the reference voltage.

Capacitors CG1 and CG2 represent the parasitic gate capacitances of FET KN3. Where these parasitic capacitances are perfectly matched, the voltage change in the clock signal during transition will inject currents evenly to both latching nodes, so that the latching injected currents cancel each other. However, if the parasitic capacitances on KN3 are unequal, the changing voltage of the clock signal during transition will inject unequal currents through KN3: $i_{source} = CG1(dv/dt) \neq i_{drain} = CG2(dv/dt)$. The injected current difference causes an voltage offset having a magnitude and direction dependent upon the capacitance mismatch. In known circuits, a few percent capacitance mismatch can result in offsets on the order of 20 mV, an unacceptable result.

Note that the comparator of FIG. 1 suffers an offset resulting from capacitance mismatch, because the clock signal is introduced directly into the latching nodes of that single stage design. According to the present invention, a second (latching) stage is provided which is separate from the input stage. In the new circuit, the clock signal is decoupled from the latching nodes, as further explained below.

Figure 2:
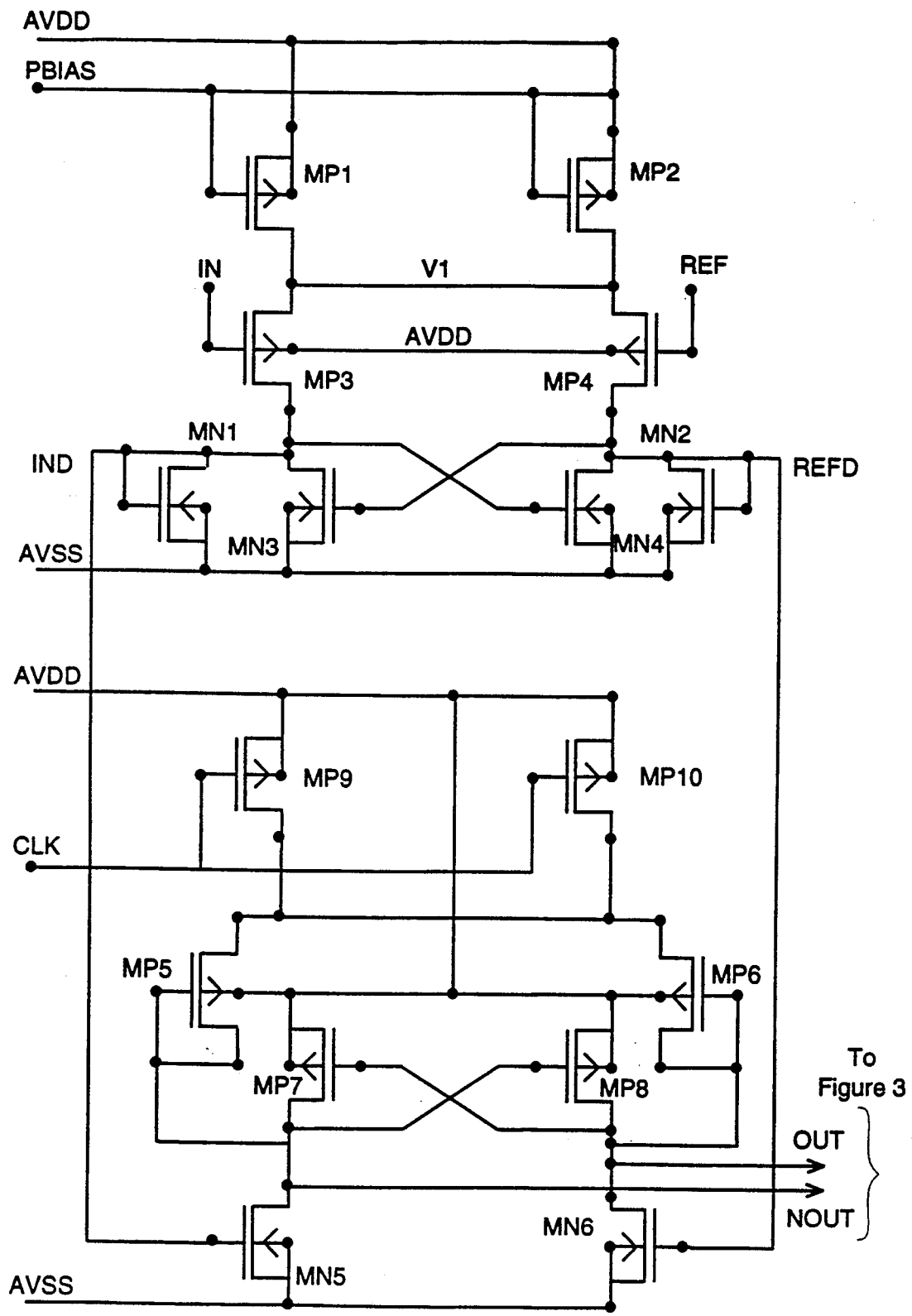

Referring now to FIG. 2, a schematic diagram of a latching comparator circuit according to the present invention is shown. Bias FETs MP1 and MP2 are coupled to an analog supply voltage rail AVDD. The gates of FETs MP1 and MP2 are controlled by predetermined bias voltage, PBIAS, so as to provide a suitable bias current. A useful total bias current is on the order of 25–50 μA. The total supply voltage AVDD-AVSS may be, for example, 15 volts.

A first differential pair of transistors, MP3 and MP4, are coupled to the bias transistors and have their drain terminals connected together at node V1. The gate of MP3 is connected to receive an input voltage IN and the gate of MP4 is coupled to receive a reference voltage REF. The body or substrate are connected to AVDD.

In operation, when the input voltage VIN equals the reference voltage VREF, equal currents flow in the source terminals of MP3 and MP4. When the input voltages are unequal, a greater portion of the bias current flows in the device subjected to the greater gate voltage, and a correspondingly lesser current flows in the device having the relatively lower gate voltage. Thus the input pair amplify and convert the (differential) input voltage to a differential current.

A first cross-coupled pair of transistors, MN3 and MN4, are disposed between the source terminals of the first differential pair and the lower analog supply rail AVSS. Specifically, the gate of MN3 is coupled to the drain of MN4, which also is coupled to the source of MP4. Similarly, the gate of MN4 is coupled to the drain of MN3 which is also is coupled to the source of MP3. These nodes are labeled REFD and IND, respectively. The cross-coupled pair form a positive feedback amplifier. The gain is controlled, however, as explained below.

A diode-connected transistor MN1 is disposed in parallel with FET MN3. Similarly, a diode connected transistor MN2 is disposed in parallel to FET MN4. The circuitry formed by FETs MN1, MN2, MN3 and MN4, i.e. the first cross-coupled pair combined with a pair of diode connected transistors disposed in parallel to the cross-coupled pair, we call a Moore Mirror circuit.

The Moore Mirror circuit operates generally as follows. The Moore Mirror circuit provides loads to the input differential pair. The cross-coupled pair develops very large gain. However, the diode-connected transistors regulate and limit that gain, as well as shift the voltage to around $1V_{TH}$ above AVSS.

The diode-connected transistors MN1,MN2 are parallel to the amplifier pair MN3,MN4 respectively. When turned ON, the diode transistors act somewhat like resistors. Current is divided between the parallel devices. For example, the current from input device MP3 is divided between MN1 and MN3. The current ratio is proportional to the relative sizes of the devices, at least when the circuit is balanced. This allows setting the gain in the cross-coupled pair. To illustrate, if MN1 is much smaller than MN3, most of the current flows through MN3, and the amplifier has very high (theoretically near infinite) gain. A relatively larger MN3 diverts current and, therefore, reduces the positive feedback in the amplifier. This reduces the gain. The gain can be controlled by sizing the devices in a desired ratio.

The Moore Mirror circuitry was found to be very stable when the diode-connected transistor is made slightly larger than the cross-coupling transistor. In one example of an operative embodiment, the diode-connected transistor is about 14% larger than the cross-coupling transistor. See Table below. This yields a gain of around 10 to 20. Thus, for example, a differential input voltage of 1 mV across the IN and REF nodes results in a swing on the order of 10 to 20 mV at the IND and REFD nodes. Moreover, the diode-connected transistors being sized larger is instrumental in maintaining the stability of the input stage in the event of device mismatch during fabrication. This is achieved through preventing the circuit from becoming a positive feedback configuration unintentionally due to a device mismatch. In the Moore Mirror, we depend on the strength of the diode-connected transistors to limit the gain from the cross-coupled transistors. If the diode-connected transistors become too small relative to the cross-coupled transistors, this purpose might be defeated.

A gain having an order of magnitude of 10 for the input stage in the two-stage design is useful. The actual value selected for any particular design depends upon several parameters, and trading off various factors. A gain around 10 or 20 is adequate in the preferred embodiment for reducing device mismatch offset and providing good signal to noise ratio. Higher gains may further improve those factors, but at the expense of higher operating currents and slower operation.

The IND and REFD nodes form the output of the first or input stage, and are coupled to the second or latching stage as follows. The latching stage includes a second differential pair of transistors MN5, MN6. These devices are common source coupled to the supply rail AVSS. The MN5 gate is coupled to the IND node and the MN6 gate is coupled to the REFD node. The drain terminals of MN5 and MN6 define nodes NOUT and OUT, respectively. A load on the second differential pair provided by a dual of the Moore Mirror, as follows.

A second cross-coupled pair of transistors MP7 and MP8 are each coupled between a respective one of the second differential pair, MN5, MN6 and the first supply rail AVDD at node 4. Thus, the MP7 gate terminal is coupled to the OUT node and the MP8 gate terminal is coupled to NOUT.

A second pair of diode-connected transistors MP5, MP6 are each coupled between a respective one of the second cross-coupled pair and a switch node, node 5. Thus, MP5 is coupled between node 5 and NOUT and MP6 is coupled between node 5 and OUT. Node 5, the switch node, is coupled to the AVDD supply rail through a pair of digital switch transistors MP9 and MP10, connected in parallel. The gates of MP9, MP10 are coupled to receive the latch clock signal. A single transistor may be used as the digital switch. A pair of transistors in parallel offer smaller individual device size and layout symmetry.

The OUT signal is connected to a CMOS inverter circuit 10. The inverter circuit 10 provides an inverted output signal IOUT at appropriate CMOS logic voltage levels. Similarly, the NOUT signal is coupled to a second CMOS inverter circuit 12, which provides an inverted output signal INOUT. The output signals IOUT and INOUT are connected to an integral latch circuit 14. Details of a CMOS RS latch circuit are known. For example, see U.S. Pat. No. 4,825,100, incorporated herein by this reference. The RS latch circuit 14 provides the final comparator output signals CMPOUT and its complement NCMPOUT. Thus, when IN is higher than REF, CMPOUT is a logic low, and when IN is less than REF, CMPOUT is a logic high.

As noted above, the input stage provides a voltage gain of 10 or 20 at the nodes IND and REFD. These are coupled as inputs to the second or latching stage at the gates of devices of MN5 and MN6. Cross-coupled transistors MP7 and MP8, along with the diode-connected transistors MP5 and MP6 form a dual of the Moore Mirror circuit of the input stage. In the latch stage, however, the diode-connected transistors MP5 and MP6 are not connected directly to the supply rail AVDD. Rather, they are connected to the supply rail through the digital switch devices MP9 and MP10.

During the sample state, the digital switch is closed, so the Moore Mirror is connected as in the input stage. When the latch clock switches to latch state, turning MP9 and MP10 off, they deprive the diode connected devices MP5, MP6 of input current so they are effectively removed from the circuit. This leaves MP7 and MP8 to form a very high gain positive feedback amplifier for latching, without injecting current from the latch clock signal into the sensitive latching nodes.

In the preferred embodiment, the latching comparator is designed to resolve 1.2 mV input overdrive over a 10 V common mode range, with 1.2 mV linearity, less than 50 mV offset error, a set-up time of 1.25 μsec and latching pulse width of 500 ns. The circuit may be fabricated, for example, in a 15 V, 5 micron gate, single-layer poly, single-layer metal, twin well, fully guard ringed CMOS process. The individual device dimensions in the preferred embodiment are shown in the following table.

| Device | Width | Length |
| --- | --- | --- |
| MP1 | 48 | 11 |
| MP2 | 48 | 11 |
| MP3 | 200 | 6 |
| MP4 | 200 | 6 |
| MP5 | 10 | 6 |
| MP6 | 10 | 6 |
| MP7 | 10 | 16 |
| MP8 | 10 | 16 |
| MP9 | 10 | 6 |
| MP10 | 10 | 6 |
| MP11 | 5 | 6 |
| MP12 | 5 | 6 |
| MN1 | 20 | 11 |
| MN2 | 20 | 11 |
| MN3 | 20 | 12.5 |
| MN4 | 20 | 12.5 |
| MN5 | 20 | 11 |
| MN6 | 20 | 11 |
| MN11 | 5 | 6 |
| MN12 | 5 | 6 |

As noted, the input stage gain is set to around 10 or 20. The need for precise device and capacitance matching at the latching stage is avoided by replacing this stage with a dual of the Moore Mirror, as described above. The geometries stated in the table set the latch stage gain to approximately 2 or 3, to increase the input referred gain to about 50 or 60. Thus, for example, a 1.2 mV overdrive develops approximately 60+mV signal at the latching stage prior to latching. During latching, the digital switch is opened so that the diode connected transistors are essentially removed from this Moore Mirror. This frees the 60 mV already developed at the second cross-coupled pair to gracefully diverge into full rail-to-rail voltage swing.

An important advantage of this circuit is that switching current is not injected into the circuit by the latch clock signal, because the latch clock signal is decoupled from both pairs of sensitive nodes, IND and REFD, OUT and NOUT (the latching nodes). In fact, the current is actually reduced by opening the switch. This gives a much quieter latching environment, further reducing hysteresis.

It should be noted that the Moore Mirror load could be used in a single-stage design. For example, to modify the prior art circuit of FIG. 1, a pair of diode-connected transistors would be coupled to the amplifier pair KN1,KN2. The diode pair would be disposed between the latching nodes (drain terminals of KN1,KN2) and Vss through a digital switch transistor (or two, as per FIG. 2). The CLOCK signal would be coupled to control the diode pair, obviating KN3. This describes essentially a dual of the Moore Mirror circuit employed in the latch stage of the circuit of FIG. 2. Such a single-stage design has the advantages of fewer components, while still providing for gain selection, improved recovery and decoupling the latch clock signal from the sensitive latching nodes. It may be faster in operation than the two-stage design, but not as quiet.

Another advantage is that, since only P-type transistors (MP9 and MP10) are used as the digital switch, there is no need to derive an inverted latch clock signal. This eliminates another source of tricky timing problems. A further advantage of the circuit described above is improved recovery time because, as soon as the latching clock pulse is removed, the reinstated diode-connected pair will quickly clamp the OUT and NOUT nodes back to a voltage approximately equal to 1 $V_{TH}$ below the AVDD rail.

The CMOS latching comparator described is useful for a variety of applications. For example, it is especially well-suited to ADC applications. A comparator of the type described, or several of them, may be implemented on an analog integrated circuit, along with sample and hold circuitry, for sampled ADC applications. Having illustrated and described the principles of our invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A CMOS latching comparator circuit comprising:
   an input stage having a first differential amplifier for comparing an applied input voltage to an applied reference voltage so as to form a differential pair of intermediate signals responsive to said comparison;
   a latching stage, coupled to the input stage to receive the intermediate signals and having a second differential amplifier arranged so as to form a pair of output signals at a respective pair of latching nodes responsive to the intermediate signals; and
   a digital switch means, coupled to the second differential amplifier and coupled to receive a binary latch clock signal, for controlling the second differential amplifier so as to provide low gain while the latch clock signal is in a sample state and to provide high gain while the latch clock signal is in the latch state;
   the latch clock signal being coupled only to the digital switch means thereby decoupling the latch clock signal from the input stage and from the latching nodes to minimize charge injection offset in the comparator due to parasitic capacitance mismatch.

2. A CMOS latching comparator circuit according to claim 1 wherein the latching stage includes:
   a differential pair of transistors coupled to the input stage to receive the intermediate signals, respectively;
   a cross-coupled pair of transistors each disposed between a respective one of the differential pair of transistors and a power supply rail so as to form the second differential amplifier;
   a pair of diode-connected transistors, each one of the diode-connected transistors disposed between a respective one of the cross-coupled pair of transistors and a power supply rail, for controlling gain in the second differential amplifier; and wherein
   the digital switch means is coupled to control the pair of diode-connected transistors responsive to the latch clock signal.

3. A CMOS latching comparator circuit according to claim 1 wherein the first stage includes:
   a first differential pair of transistors each having a gate terminal coupled to receive the input voltage and the reference voltage, respectively;
   a first cross-coupled pair of transistors each disposed between a respective one of the first differential pair of transistors and a lower power supply rail so as to form the first differential amplifier; and
   a first pair of diode-connected transistors, each one of the diode-connected transistors disposed in parallel to a respective one of the first cross-coupled pair of transistors, for controlling gain in the first differential amplifier.

4. A CMOS latching comparator circuit according to claim 3 wherein the first pair of diode-connected transistors are sized larger than the first cross-coupled pair of transistors so as to provide a desired finite gain.

5. A CMOS latching comparator circuit according to claim 3 wherein:
   the first differential pair of transistors consist of P-channel FET devices;
   the first cross-coupled pair includes a pair of N-channel FET devices; and
   the first diode-connected pair includes a pair of N-channel FET devices.

6. A CMOS latching comparator circuit according to claim 2 wherein the latching stage includes:
   a second differential pair of transistors coupled to the input stage to receive the intermediate signals;
   a second cross-coupled pair of transistors, each disposed between a respective one of the second differential pair of transistors and a power supply rail, for amplifying the intermediate signals; and
   a second pair of diode-connected transistors, each one of the second pair of diode-connected transistors disposed between a respective one of the second cross-coupled pair and a switch node; and wherein
   the digital switch means is disposed between the switch node and the upper power supply for selectively coupling the switch node to the supply responsive to the latch clock signal, so that the second pair of diode-connected transistors are coupled in parallel to the second cross-coupled pair during the sample state of the latch clock signal and are effectively removed from the circuit during the latch state of the latch clock signal.

7. A CMOS latching comparator circuit according to claim 2 wherein the digital switch means consists of at least one P-channel transistor.

8. A CMOS latching comparator circuit comprising:
an input differential pair of transistors;
a first cross-coupled pair of transistors (MN3,MN4), each coupled between a respective one of the input differential pair and a power supply and each defining a respective one of a pair of intermediate nodes (IND,REFD);
a first pair of diode-connected transistors (MN1,MN2), each coupled in parallel to a respective one of the first cross-coupled pair to control gain in the first cross-coupled pair;
a second differential pair of transistors (MN5,MN6) coupled to the second supply VSS, each having a gate terminal coupled to a respective one of the intermediate nodes;
a second cross-coupled pair of transistors (MP7,MP8), each coupled between a respective one of the second differential pair and the first supply VDD;
a second pair of diode-connected transistors (MP5,MP6), each one of the second pair of diode-connected transistors disposed between a respective one of the second cross-coupled pair and a switch node; and
digital switch means (MP9,MP10), disposed between the switch node and the first supply VDD, for selectively coupling the switch node to VDD responsive to a binary latch clock signal, so that the second pair of diode-connected transistors are effectively coupled in parallel to the second cross-coupled pair of transistors during the sample state of the latch clock signal and are effectively removed from the circuit during the latch state of the latch clock signal.

9. A CMOS latching comparator circuit according to claim 8 wherein:
the input differential pair each include drain, source and gate terminals, the gate terminals are coupled to receive an input voltage and a reference voltage, respectively, and the drain terminals are coupled together to a bias current source;
the first cross-coupled pair each include drain, source and gate terminals, the drain terminals coupled to the input differential pair source terminals, and the gate terminals cross-coupled to the drain terminals for positive feedback; and
the first pair of diode-connected transistors each have drain, source and gate terminals, the drain and gate terminals being connected together to the corresponding cross-coupled transistor drain terminal, and the source terminal coupled to the corresponding cross-coupled transistor source terminal, so as to divert from the corresponding cross-coupled transistor a portion of the corresponding differential pair source current, thereby reducing the gain in the cross-coupled pair.

10. A CMOS latching comparator circuit according to claim 9 wherein the diode-connected transistors are sized larger than the cross-coupled transistors so as to set a gain in the first cross-coupled pair on the order of 10 and to ensure stability in the input stage.

11. A CMOS latching comparator circuit according to claim 8 wherein:
the second differential pair each include drain, source and gate terminals, the gate terminals are coupled to the intermediate nodes, respectively, and the source terminals are coupled to a power supply;
the second cross-coupled pair each include drain, source and gate terminals, the source terminals coupled to the second differential pair drain terminals, and the gate terminals cross-coupled to the source terminals for positive feedback; and
the second pair of diode-connected transistors each have drain, source and gate terminals, the source and gate terminals being connected together to the corresponding cross-coupled transistor source terminal, and the drain terminals connected together to the switch node, so as to divert current from the corresponding cross-coupled transistor while the digital switch is ON, thereby reducing the gain in the second cross-coupled pair.

12. A CMOS latching comparator circuit according to claim 11 wherein the second diode-connected transistors are sized larger than the second cross-coupled transistors so as to set a gain in the second cross-coupled pair on the order of 2-3.

13. In a latching CMOS comparator arranged to receive an input voltage, a reference voltage and a binary latch clock signal, the latch clock signal having a sample state and a latch state, for providing a output signal responsive to a comparison of the input voltage to the reference voltage when the latch clock signal last changed from the sample state to the latch state, a method of decoupling the latch clock signal to minimize offset error due to parasitic capacitance mismatch, the method comprising the steps of:
providing an input stage having a first differential amplifier for comparing the input voltage to the reference voltage and providing a differential intermediate signal;
isolating the latch clock signal from the input stage;
providing a latching stage coupled to the input stage to receive the intermediate signal, the latching stage including a second differential amplifier;
controlling gain in the second differential amplifier responsive to the latch clock signal so that the second differential amplifier has a first gain during the sample state of the latch clock signal and;
responsive to the latch clock signal changing to the latch state, increasing the gain in the second differential amplifier to a value greater than the first gain.

14. A method according to claim 13 wherein the second differential amplifier includes a cross-coupled pair of transistors and further comprising:
providing a digital switch coupled to receive the latch clock signal; and
during a sample state of the latch clock signal, diverting current around each of the cross-coupled transistors so as to reduce gain in the second cross-coupled pair.

15. A method according to claim 13 including:
isolating the latch clock signal from the input stage by providing a latching stage; and
isolating the latch clock signal from the latching stage by providing a digital switch and coupling the digital switch to receive the latch clock signal for controlling gain in the latching stage, whereby the latch clock signal is not connected directly to the input stage or to the latching stage.

* * * * *